(12) United States Patent
Yamada et al.

(10) Patent No.: US 8,330,557 B2
(45) Date of Patent: Dec. 11, 2012

(54) SURFACE ACOUSTIC WAVE DEVICE HAVING CONCENTRICALLY ARRANGED ELECTRODES

(75) Inventors: Hideaki Yamada, Kariya (JP); Kazuhiko Kano, Toyoake (JP)

(73) Assignee: DENSO CORPORATION, Kariya (JP)

( * ) Notice: Subject to any disclaimer, the term of this patent is extended or adjusted under 35 U.S.C. 154(b) by 399 days.

(21) Appl. No.: 12/659,197

(22) Filed: Feb. 26, 2010

(65) Prior Publication Data

US 2010/0219910 A1    Sep. 2, 2010

(30) Foreign Application Priority Data

Mar. 2, 2009   (JP) .................... 2009-47818

(51) Int. Cl.
  *H03H 9/145* (2006.01)
  *H03H 9/25* (2006.01)
  *H03H 9/64* (2006.01)
(52) U.S. Cl. .............. 333/193; 333/195; 310/313 B
(58) Field of Classification Search .......... 333/193–196; 310/313 B, 313 D, 365, 366, 369
   See application file for complete search history.

(56) References Cited

U.S. PATENT DOCUMENTS

| | | | | |
|---|---|---|---|---|
| RE23,813 E | * | 4/1954 | Adler | 369/144 |
| 3,114,849 A | * | 12/1963 | Poschenrieder | 310/330 |
| 3,523,200 A | * | 8/1970 | Newell | 310/313 B |
| 3,582,838 A | * | 6/1971 | DeVries | 333/194 |
| 3,760,204 A | * | 9/1973 | Yester, Jr. | 310/313 B |
| 4,453,242 A | * | 6/1984 | Toda | 369/132 |
| 5,307,035 A | * | 4/1994 | Dufilie et al. | 333/193 |
| 5,374,863 A | * | 12/1994 | Mochizuki et al. | 310/313 D |
| 5,953,027 A | | 9/1999 | Suwabe et al. | |
| 6,353,371 B1 | * | 3/2002 | Kadota et al. | 333/133 |
| 6,744,333 B2 | * | 6/2004 | Sawada | 333/133 |
| 6,879,225 B2 | * | 4/2005 | Kadota et al. | 333/193 |
| 8,004,147 B2 | * | 8/2011 | Biryukov et al. | 310/313 B |
| 2004/0183397 A1 | | 9/2004 | Kam et al. | |
| 2005/0083785 A1 | | 4/2005 | Shiokawa et al. | |
| 2007/0252485 A1 | | 11/2007 | Kawakubo et al. | |
| 2009/0114798 A1 | * | 5/2009 | Tigli et al. | 250/200 |

FOREIGN PATENT DOCUMENTS

| | | | |
|---|---|---|---|
| JP | 61-199314 | * | 9/1986 |
| JP | A-04-299212 | | 10/1992 |
| JP | A-09-150502 | | 6/1997 |
| JP | A-H9-183225 | | 7/1997 |

(Continued)

OTHER PUBLICATIONS

Office Action mailed Feb. 8, 2011 issued in corresponding JP patent application No. 2009-047818 (English translation enclosed).

(Continued)

*Primary Examiner* — Barbara Summons
(74) *Attorney, Agent, or Firm* — Posz Law Group, PLC

(57) ABSTRACT

A surface acoustic wave device is disclosed. The surface acoustic wave device includes: a substrate having a plane surface; multiple first electrodes formed on the plane surface of the substrate; and multiple second electrodes formed on the plane surface of the substrate. Each of the first and second electrodes has a predetermined closed ring shape. The first and second electrodes are concentric. The second electrodes are located radially inside or radially outside of the first electrodes.

4 Claims, 11 Drawing Sheets

FOREIGN PATENT DOCUMENTS

| | | |
|---|---|---|
| JP | A-2002-026688 | 1/2002 |
| JP | A-2003-535546 | 11/2003 |
| JP | A-2005-210294 | 8/2005 |
| JP | A-2005-318547 | 11/2005 |
| JP | A-2007-181087 | 7/2007 |
| SU | 627558 * | 8/1978 |

OTHER PUBLICATIONS

Office Action mailed Feb. 8, 2011 from the Japan Patent Office for corresponding Japanese patent application No. 2009-047818 (English translation enclosed).

* cited by examiner

SURFACE ACOUSTIC WAVE DEVICE HAVING CONCENTRICALLY ARRANGED ELECTRODES

CROSS REFERENCE TO RELATED APPLICATION

The present application is based on Japanese Patent Application No. 2009-47818 filed on Mar. 2, 2009, disclosure of which is incorporated herein by reference.

BACKGROUND OF THE INVENTION

1. Field of the Invention

The present invention relates to a surface acoustic wave device, more particularly to a surface acoustic wave device in which a transducer is arranged on a plane surface of a substrate.

2. Description of Related Art

A typical surface acoustic wave device (SAW device) includes a substrate, an interdigital transducer (IDT), and another IDT or a reflector. The IDT and the reflector are formed on a substrate. The IDT generates or receives a surface acoustic wave on the substrate. The reflector reflects the surface acoustic wave.

A typical IDT has an interdigital shape (comb shape), and includes digital parts (finger-like parts) with a straight line shape. JP-2005-111471A corresponding to US-2005/0083785A discloses a SAW device in which an IDT is composed of straight line parts or circular arc parts.

In a plane type SAW device, an IDT is formed on a plane surface of a substrate. A conventional plane type SAW device thus has a problem of diffracting a surface acoustic wave and dissipating the energy of surface acoustic wave. To address this problem, JP-2002-26688A discloses a spherical type SAW device in which an IDT is formed on a spherical surface of a spherical substrate.

A reason of occurrence of the diffraction in a conventional plane type SAW device is that an IDT or a reflector has ends because of its straight line shape or circular arc shape. In a conventional plane type SAW device, a surface acoustic wave generated by an IDT is escaped from a space between the IDT and the reflector or between the IDT and the IDT due to the diffraction. A conventional plane type SAW device cannot efficiently use all of the surface acoustic wave energy generated by the IDT.

A technique described in JP-2002-26688A may suppress the diffraction by placing an electrode on the spherical surface. However, the technique described in JP-2002-26688A cannot be applied to a plane type SAW device to suppress the diffraction, because an electrode of the plane type SAW device is located on the plane surface of the substrate.

SUMMARY OF THE INVENTION

In view of the above and other points, it is an objective of the present invention to provide a plane type SAW device capable of utilizing surface acoustic wave energy in an efficient manner.

According to a first aspect of the present invention, a surface acoustic wave device is provided. The surface acoustic wave device includes: a substrate, a first electrode unit and a second electrode unit. The substrate has a plane surface, and at least a part of the substrate is made of a piezoelectric material. The first electrode unit is formed on the plane surface of the substrate and configured to generate or receive a surface acoustic wave. The second electrode unit is formed on the plane surface of the substrate and is spaced apart from the first electrode unit. The first electrode unit includes multiple first electrodes each having a predetermined closed ring shape composed of one of a curved line and a polygonal chain. The multiple first electrodes are concentric with respect to a predetermined center point and are arranged at predetermined intervals. The second electrode unit includes multiple second electrodes each having the predetermined closed ring shape. The multiple second electrodes are concentric with respect to the predetermined center point and are arranged at the predetermined intervals. The second electrode unit is located radially inside or radially outside of the first electrode unit.

According to the above surface acoustic wave device, since each of the multiple first and second electrodes has a closed ring shape and has no ends, it is possible to suppress an occurrence of diffraction. The above surface acoustic wave device can therefore utilize surface acoustic wave energy more efficiently than a conventional surface acoustic wave device.

According to a second aspect of the present invention, a surface acoustic wave device is provided. The surface acoustic wave device includes a substrate, a first electrode unit, a second electrode unit and a wiring. The substrate has a plane surface, and at least a part of the substrate is made of a piezoelectric material. The first electrode unit is formed on the plane surface of the substrate and configured to generate or receive a surface acoustic wave. The second electrode unit is formed on the plane surface of the substrate and is spaced apart from the first electrode unit. The wiring is formed on the plane surface of the substrate and is connected with the first electrode unit. The first electrode unit includes multiple first electrodes each having a predetermined ring shape. The first electrodes are concentric with respect to a predetermined center point and are arranged at predetermined intervals. The second electrode unit includes multiple second electrodes each having the predetermined ring shape. The second electrodes are concentric with respect to the predetermined center point and are arranged at the predetermined intervals. The second electrode unit is located radially inside or radially outside of the first electrode unit. The predetermined ring shape is composed of one of a curved line and a polygonal chain so as to avoid the wiring.

According to the above surface acoustic wave device, since each of the multiple first and second electrodes has an approximately-closed ring shape, the above surface acoustic wave device can utilize surface acoustic wave energy more efficiently than a conventional surface acoustic wave device, in which an electrode has a straight line shape or a circular arc shape and a relatively large amount of the surface acoustic wave energy is dissipated due to an end of the electrode.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Figure 1:
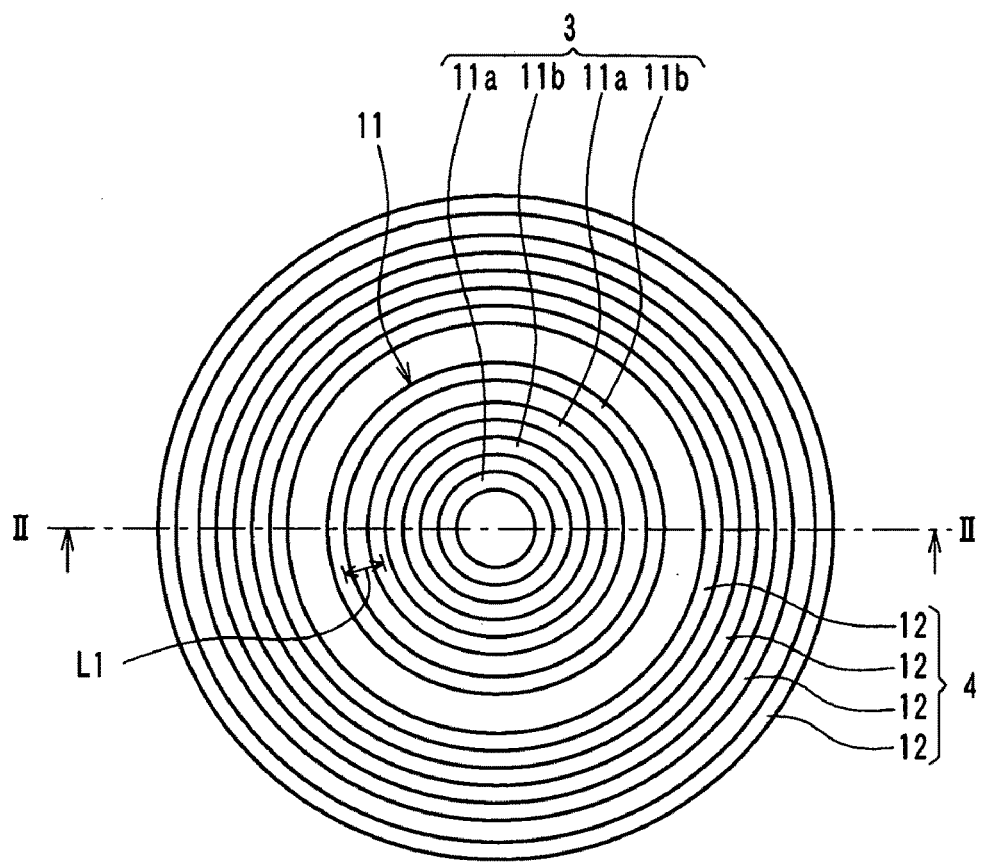
FIG. 1 is a diagram illustrating a layout on an upper surface of a SAW device according to a first embodiment.

The exemplary embodiments will be described below with reference to the accompanying drawings. In the below-described embodiments, like reference numerals refer to like parts.

First Embodiment

A surface acoustic wave device 1 (SAW device 1) according to a first embodiment is illustrated below with reference to FIGS. 1 and 2.

Figure 2:
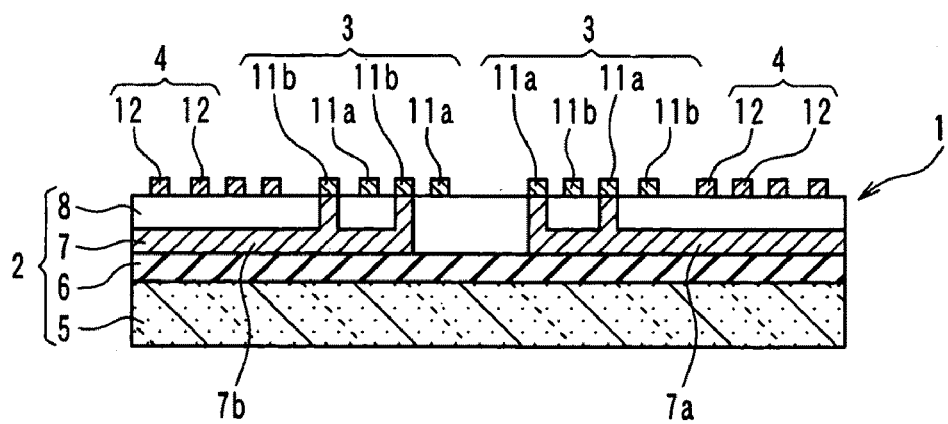
FIG. 2 is a diagram illustrating a cross section taken along line II-II in FIG. 1.

As shown in FIGS. 1 and 2, the SAW device 1 includes a substrate 2, a transducer 3 and a reflector 4. The substrate 2 has an upper surface and a lower surface opposite to each other. The upper surface of the substrate 2 is a plane surface. The transducer 3 and the reflector 4 are located on the plane surface of the substrate 2, and respectively can act as a first electrode unit and a second electrode unit. A wiring 7 electrically connected with the transducer 3 is formed inside the substrate 2. The transducer 3 can act as an electrode unit for generating or receiving a surface acoustic wave. It should be noted that, as described below in detail, the electrode shape of the transducer 3 is different from that of a conventional inter-digital transducer (IDT). This difference in shape is also the cases for the below-described embodiments.

The substrate 2 includes a base 5, an oxide film 6, a wiring 7 and a piezoelectric film 8, which are laminated in this order from the lower surface to the upper surface of the substrate 2. Although now shown in the drawings, the shape of the plane surface of the substrate 2 may be quadrilateral for example. The base 5 is for example, a silicon substrate. The oxide film 6 is, for example, a silicon oxide film. The wiring 7 includes a first wiring 7a and a second wiring 7b, which are electrically separated from each other and made of Al or the like. The piezoelectric film 8 is made of a piezoelectric material, e.g., Aluminum Nitride (AlN).

As shown in FIG. 1, the transducer 3 includes multiple electrodes 11 each having a circular closed ring shape. The multiple electrodes 11 are concentric with respect to a predetermined center point and are arranged at predetermined intervals. More specifically, the multiple electrodes 11 are arranged at regular intervals such that an interval between adjacent electrodes 11 is set to half-wavelength ($\lambda/2$) of surface acoustic wave. The reflector 4 includes multiple electrodes 12 each having a circular closed-ring shape as similarly as the electrode 11 of the transducer 3 The multiple electrodes 12 are concentric with respect to the transducer 3 (the predetermined center point) and arranged at the predetermined intervals. The multiple electrodes 12 are located radially outside of the multiple electrodes 11, and surround the transducer 3. The multiple electrodes 11, 12 of the reflector 4 and the transducer 3 are concentric and have geometrical similarity.

As shown in FIGS. 1 and 2, the multiple electrodes 11 of the transducer 3 has an electrode 11a connected with the first wiring 7a and an electrode 11b connected with the second wiring 7b. The electrode 11a and the electrode 11b are alternately arranged. The first and second wirings 7a and 7b are located at a depth of more than one-wavelength of surface acoustic wave below the upper surface of the substrate 2, because the surface acoustic wave propagates along the upper surface while deforming a surface portion between the upper surface and the depth of one-wavelength of surface acoustic wave is straining.

It is possible to manufacture the SAW device 1 by modifying a manufacturing method of a typical SAW device. The modifying includes changing a process of forming a substrate 2 and changing a pattern of the transducer 3 and a pattern of the reflector 4.

More specifically, as shown in FIG. 2, the substrate 2 is prepared by forming an oxide film 6, a wiring 7 and a piezoelectric film 8 over a base 5. In forming the substrate 2, as a process of forming the oxide film 6 and the wiring 7 over the base 5, it is possible to use a process used in IC chip fabrication to form multilayer wiring on a semiconductor substrate. The piezoelectric film 8 may be formed by sputtering for example.

Then, for example, a metal thin film such as Al thin film and the like is formed on the substrate 2 by sputtering or the like. Then, the metal thin film is shaped into a desired electrode pattern by photolithography and etching, and thereby, the transducer 3 and the reflector 4 are formed. Then, a process similar to that used in a manufacturing method of a typical SAW device is performed. Through the above manners, the SAW device 1 of the present embodiment can be manufactured.

The SAW device 1 of the present embodiment can be used as a resonator, a filter or the like. When the SAW device 1 is used as a resonator for example, the transducer 3 acts as a driving electrode unit. When a predetermined AC voltage is applied to the driving electrode unit, the driving electrode unit generates a surface acoustic wave spreading in a circular pattern. The surface acoustic wave spreading in a circular pattern has larger amplitude at location closer to the center of the surface acoustic wave, and has smaller amplitude with increasing distance from the center. The surface acoustic wave spreading in a circular pattern has a constant frequency independently from location. The surface acoustic wave is reflected at the reflector 4 and confined to a space between the transducer 3 and the reflector 4, thereby forming a standing wave.

In the present embodiment, each electrode 11, 12 of the transducer 3 and the reflector 4 has a circular ring shape, in other words, a completely-closed ring shape. Since the closed-ring shaped electrode 11, 12 has no end along an extension direction thereof, it is possible to minimize occurrence of diffraction. Hence, the present embodiment can efficiently utilize all of the surface acoustic wave energy generated by the transducer 3, and it is possible to improve "Q factor" compared to a conventional SAW device, in which an interdigital transducer (IDT) is made by a straight line shaped or circular arc shaped electrode. In the present disclosure, the Q factor is a parameter that describes how much surface acoustic wave generated by the transducer is confined to a space between the transducer and the reflector or a space between the transducers.

Second Embodiment

A SAW device 1 according to a second embodiment is illustrated below with reference to FIG. 3. The present embodiment is different from the first embodiment in electrode pattern of the transducer 3 and the reflector 4.

Figure 3:
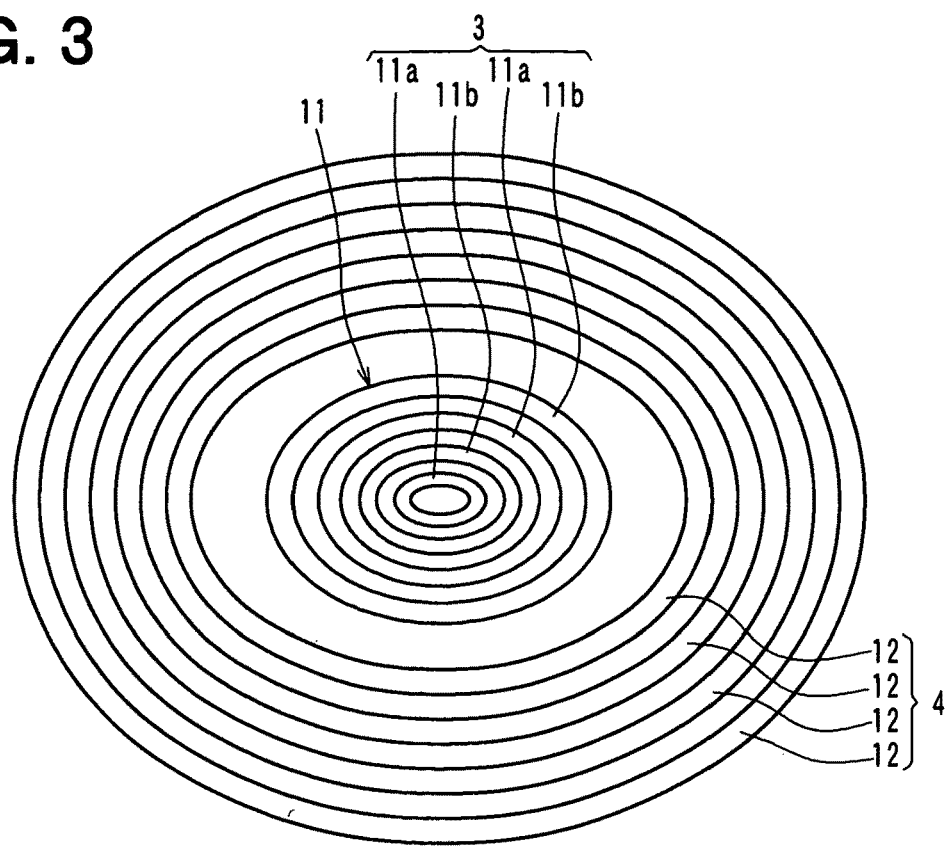
FIG. 3 is a diagram illustrating a layout on an upper surface of a SAW device according to a second embodiment.

As shown in FIG. 3, in the present embodiment, each of the multiple electrodes 11 of the transducer 3 has an ellipsoidal ring shape and each of the multiple electrodes 12 of the reflector 4 has also the ellipsoidal ring shape; while, in the first embodiment, each electrode 11, 12 of the transducer 3 and the reflector 4 has a circular ring shape. Since each electrode 11, 12 of the transducer 3 and the reflector 4 of the present embodiment has also a completely-closed ring shape, the present embodiment has the same advantages as the first embodiment has.

Third Embodiment

A SAW device 1 according to a third embodiment is illustrated below with reference to FIG. 4. The present embodiment is different from the first embodiment in electrode pattern of the transducer 3 and the reflector 4.

Figure 4:
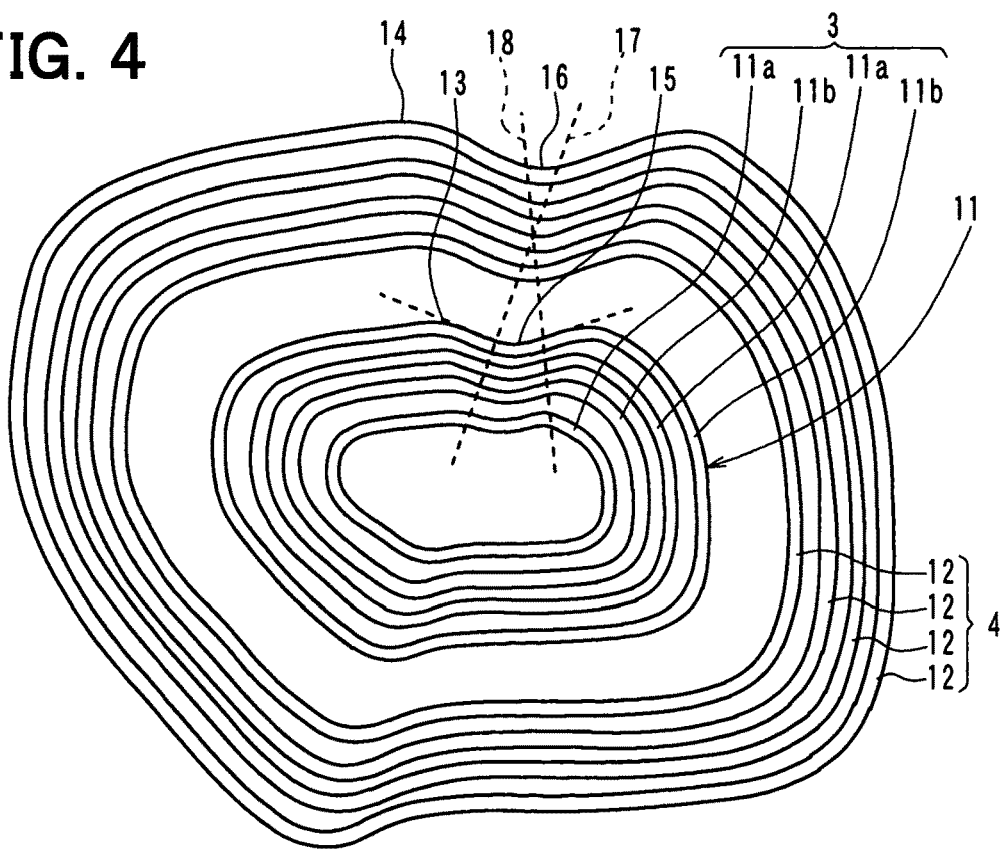
FIG. 4 is a diagram illustrating a layout on an upper surface of a SAW device according to a third embodiment.

As shown in FIG. 4, in the present embodiment, each of the multiple electrodes 11, 12 of the transducer 3 and the reflector 4 has such a closed-ring shape that contains an outwardly-convexed (outwardly-projecting) curved-part 13, 14 and an inwardly-convexed (inwardly-projecting) curved-part 15, 16; while, in the first and second embodiments, each electrode 11, 12 of the transducer 3 and the reflector 4 has a circular or ellipsoidal ring shape. In the above, the outwardly-convexed curved-part 13, 14 is a curved part that is convexed toward an outside of the closed ring shape, and the inwardly-convexed curved-part 15, 16 is a curved part that is convexed toward an inside of the closed ring shape. Since each electrode 11, 12 of the transducer 3 and the reflector 4 of the present embodiment has also a completely-closed ring shape, the present embodiment has the same advantages as the first embodiment has.

When each electrode 11, 12 of the transducer 3 and the reflector 4 is shaped into a ring composed of a curved line as is the cases for the first, second and third embodiments, it may be preferable to employ a closed-ring shape composed of only an outwardly-convexed curved line (e.g., a circular ring, an ellipsoidal ring as illustrated in the first and second embodiments) than such a closed-ring shape that contains both of an outwardly-convexed curved-part 13, 14 and an inwardly-convexed curved-part 15, 16. A reason for it is as follows.

In the present embodiment, as shown in FIG. 4, the electrode 11 of the transducer 3 contains two inwardly-convexed curved-parts 15, 16. Two normal lines 17, 18 which are respectively normal to the two inwardly-convexed curved-parts 15, 16 can cross each other at a cross-point on an outside of the transducer 3. In this case, the reflector 4 at the cross-point cannot reflect two incident waves with different incident directions in such way that reflected wave directions are respectively opposite to the incident directions. Thus, the SAW device 1 of the present embodiment may have the reflector 4 with low reflection efficiency and may be a lowered Q value.

When the electrode 11 of the transducer 3 has a closed-ring shape composed of only a outwardly-convexed curved-part (e.g., a circular or ellipsoidal ring shape illustrated in the first and second embodiments), the two normal lines do not cross each other on a radially outside of the closed curve but always cross each other on a radially inside of the closed curve even if the two normal lines are respectively normal to the closed curve of the closed-ring shape at arbitrary two points. Thus, all of the surface acoustic wave propagating from the transducer 3 can be reflected by the reflector 4 in a proper manner. The SAW device 1 of the first and second embodiment can have the reflector 4 with high reflection efficiency and improve the Q value compared to the third embodiment.

Moreover, when a comparison is made among the first, second and third embodiments, the first embodiment may be preferable because the circular-ring shape of each electrode 11, 12 of the transducer 3 and the reflector 4 can minimize a configuration of the transducer 3 and the reflector 4.

Fourth Embodiment

A SAW device 1 of a fourth embodiment is illustrated below with reference to FIG. 5. The present embodiment is different from the first embodiment in electrode pattern of the transducer 3 and the reflector 4.

Figure 5:
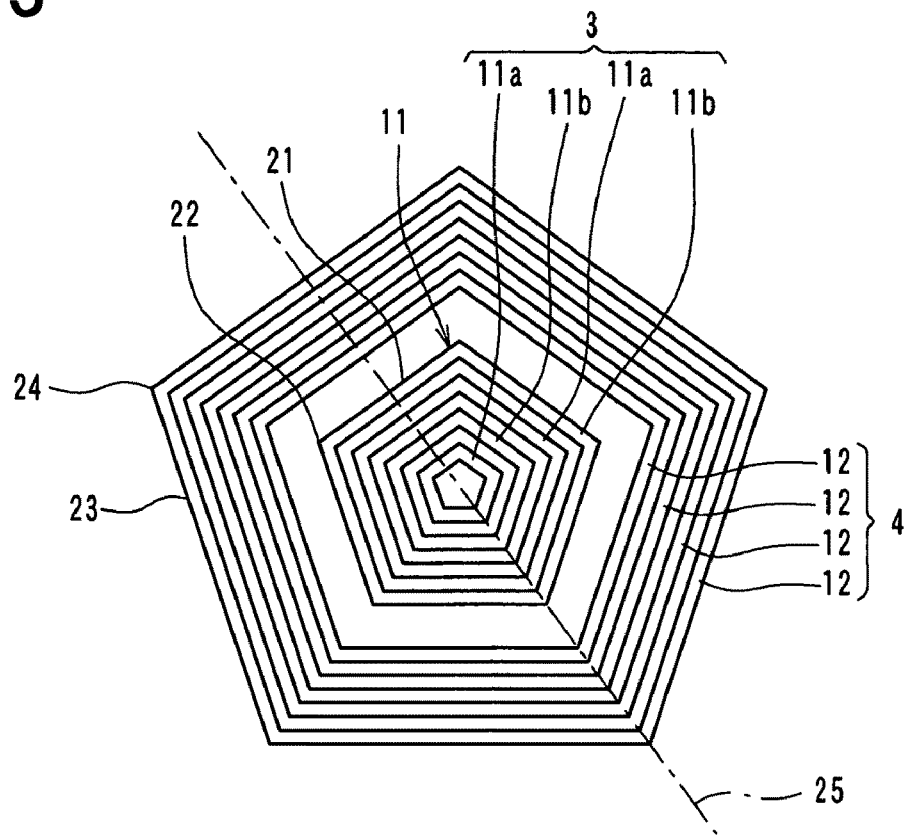
FIG. 5 is a diagram illustrating a layout on an upper surface of a SAW device according to a fourth embodiment.

In the present embodiment, as shown in FIG. 5, each electrode 11, 12 of the transducer 3 and the reflector 4 has a polygonal ring shape with a odd number of corners. For example, each electrode 11 of the transducer 3 has a regular pentagonal ring shape composed of five straight line segments 21 and five corners 22. Each electrode 12 of the reflector 4 has also a regular pentagonal ring shape composed of five straight line segments 23 and five corners 24. Alternatively, the number of straight line segments 21, 23 and the number of corners 22, 24 may be more than or less then five as long as the number is odd. Further, the polygonal ring shape of each electrode 11, 12 may not be limited to a regular polygonal ring.

As described above, each electrode 11, 12 of the transducer 3 and the reflector 4 has a polygonal ring shape, and has a completely-closed ring shape composed of a closed polygonal chain. Therefore, since each electrode 11, 12 of the transducer 3 and the reflector 4 of the present embodiment has also a completely-closed ring shape, the present embodiment has the same advantages as the first embodiment has.

Further, in the present embodiment, since each electrode 11, 12 of the transducer 3 and the reflector 4 is formed as a polygonal ring shape with an odd number of corners, when a constraint condition such as application and the like needs this kind of shape, the present embodiment can support such needs. For example, when the SAW device 1 is applied to a sensor, each electrode 11, 12 of the transducer 3 and the reflector 4 may be required to have the polygonal ring shape to provide favorable sensitivity, or, the polygonal ring shape may be required if a substrate has a limited mounting surface for the transducer 3 and the reflector 4. In these cases, the present embodiment may be preferable.

Fifth Embodiment

Figure 6:
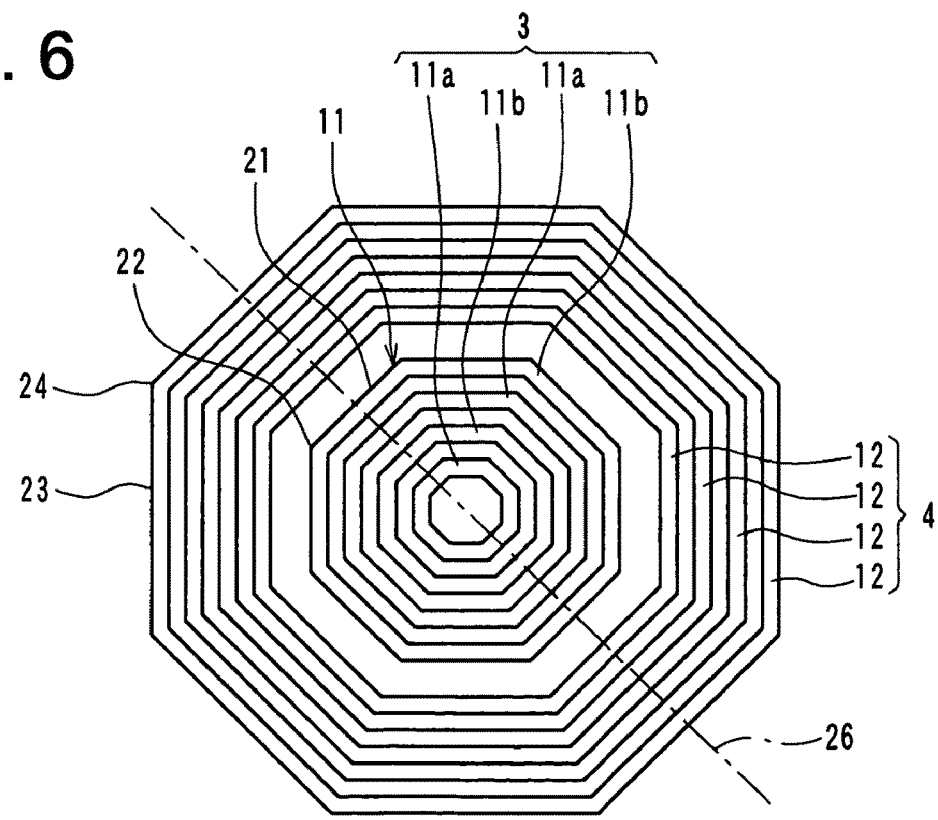
FIG. 6 is a diagram illustrating a layout on an upper surface of a SAW device according to a fifth embodiment.

A SAW device 1 of a fifth embodiment is illustrated below with reference to FIG. 6. In the present embodiment, each electrode 11, 12 of the transducer 3 and the reflector 4 has a polygonal ring shape with an even number of corners and segments; while, in the fourth embodiment, each electrode 11, 12 of the transducer 3 and the reflector 4 has a polygonal ring shape with an odd number of corners and segments More specifically, as shown in FIG. 6, each electrode 11, 12 of the transducer 3 and the reflector 4 is formed as a regular hexagonal ring shape, which has six straight line segments 21, 23 and six corners 22, 24. Alternatively, the number of straight line segments 21, 23 and the number of corners 22, 24 may be more than or less then six as long as the number is even. Further, the shape of each electrode 11, 12 may not be limited to a regular polygonal ring.

Since each electrode 11, 12 of the transducer 3 and the reflector 4 of the present embodiment has also a polygonal ring shape, in other words, a completely-closed ring shape, the present embodiment has the same advantages as the first embodiment has.

Further, in the fourth embodiment, as shown in FIG. 5, since each electrode 11, 12 of the transducer 3 and the reflector 4 has a polygonal ring shape with an odd number of corners, the electrode 11, 12 can have the following features. The dashed-dotted line 25, which is normal to one straight line segment 21 of the electrode 11 of the transducer 3, divides the electrode 12 of the reflector 4 into two parts; one part is parallel to the electrode 11 of the transducer 3; and the other part is not parallel to the electrode 11 of the transducer 3. On the other hand, in the present embodiment, as shown in FIG. 6, since each electrode 11, 12 has a polygonal ring shape with an even number of corners, the electrode 11, 12 can have the following features. The dashed-dotted line 26, which is normal to one straight line segment 21 of the electrode 11 of the transducer 3, divides the electrode 12 of the reflector 4 into two parts; one part is parallel to the electrode 11 of the transducer 3; and the other part is also parallel to the electrode 11 of the transducer 3. According to the present embodiment, since parts of the reflector 4 on opposite sides of the transducer 3 fully face each other, the present embodiment can improve the Q value more than the fourth embodiment.

Further, in the present embodiment, since the each electrode 11, 12 of the transducer 3 and the reflector 4 is formed as a polygonal ring shape with an even number of corners, if a constraint condition such as application and the like requires this kind of shape, the present embodiment can support such needs.

Sixth Embodiment

Figure 7:
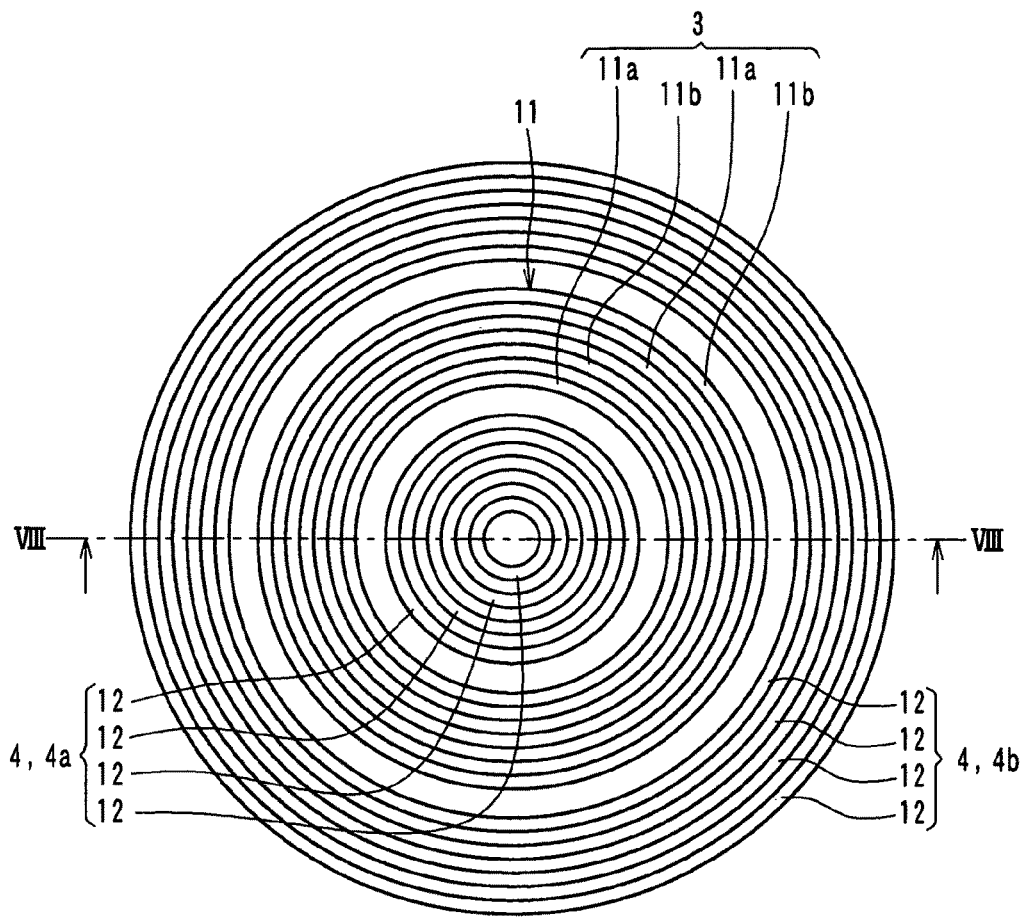
FIG. 7 is a diagram illustrating a layout on an upper surface of a SAW device according to a sixth embodiment.
Figure 8:
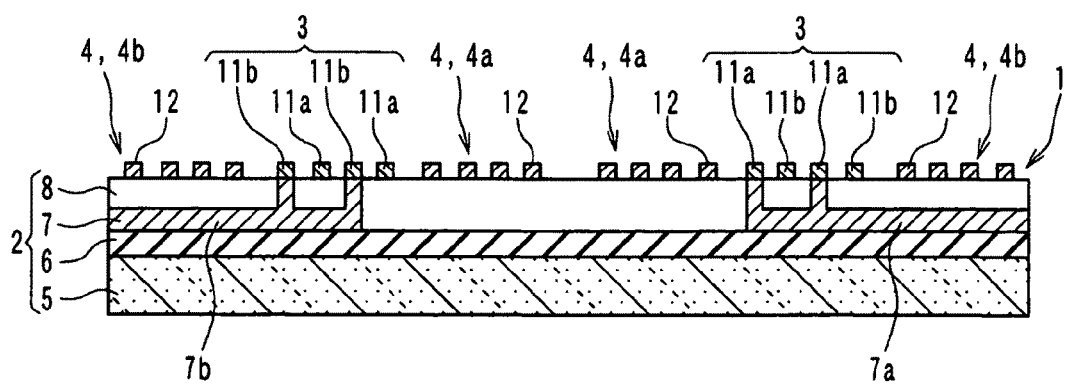
FIG. 8 is a diagram illustrating a cross section taken along line VIII-VIII in FIG. 7.

A SAW device 1 of a sixth embodiment is illustrated below with reference to FIGS. 7 and 8. The present embodiment is different from the first embodiment in configuration of the SAW device 1.

In the first embodiment, the SAW device 1 is configured such that: transducer 3 and the reflector 4 are arranged on the plane surface of the substrate 2; and the reflector 4 is arranged radially outside the transducer 3 so as to surround the transducer 3. In the present embodiment, the SAW device 1 includes a transducer 3, a first reflector 4a and a second reflector 4b each arranged on the plane surface of the substrate. The first reflector 4a is arranged radially inside of the transducer 3 so as to be surround by the transducer 3, and the second reflector 4b is arranged radially outside of the transducer 3 so as to surround the transducer 3. As similar to the first embodiment, multiple electrodes 11, 12 of the transducer 3, the first reflector 4a and the second reflector 4b are concentric and are arranged at predetermined intervals. Further, each electrode 11, 12 of the transducer 3, the first reflector 4a and the second reflector 4b has a circular ring shape. The transducer 3 can acts as a first electrode unit. Each of the first and second reflectors 4a, 4b can act as a second electrode unit.

The SAW device 1 having the above configuration can be used as, for example, a sensor that senses deformation of the substrates 2 based on amplitude.

Since each electrode 11, 12 of the transducer 3, the first reflector 4a and the second reflector 4b of the present embodiment has also a completely-closed ring shape, the present embodiment has the same advantages as the first embodiment has.

In the above-described exemplary configuration, each electrode 11, 12 of the transducer 3, the first reflector 4a and the second reflector 4b has a circular ring shape. Alternatively, each electrode 11, 12 may have a closed ring shape composed of a polygonal line or a curved line as is the cases for the second to fifth embodiments.

Seventh Embodiment

Figure 11:
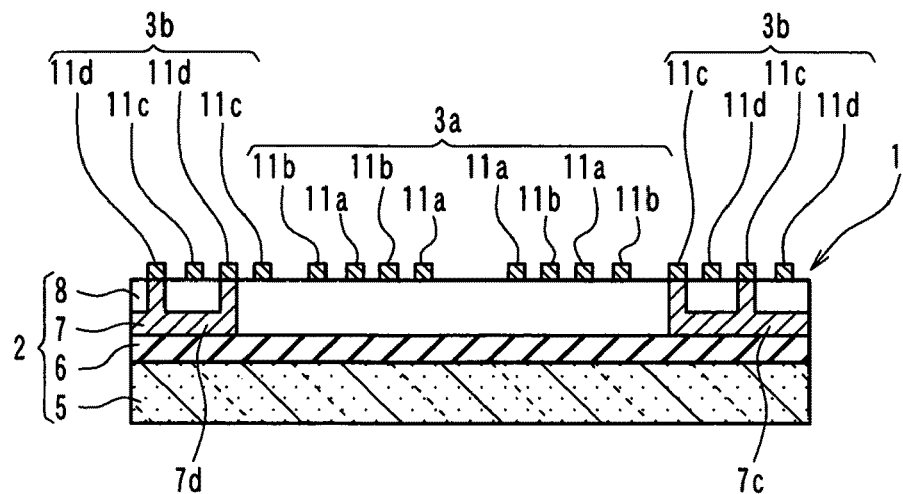
FIG. 11 is a diagram illustrating a cross sectional taken along line XI-XI in FIG. 9.

A SAW device 1 of a seventh embodiment is illustrated below with reference to FIGS. 9 and 11. The present embodiment is different from the first embodiment in configuration of the SAW device 1.

In the present embodiment, the reflector 4 of the SAW device 1 of the first embodiment is replaced with a transducer 3. Thus, the SAW device 1 of the present embodiment includes two transducer 3 (i.e., a first transducer 3a and a second transducer 3b) on the plane surface of the substrate 2.

Figure 9:
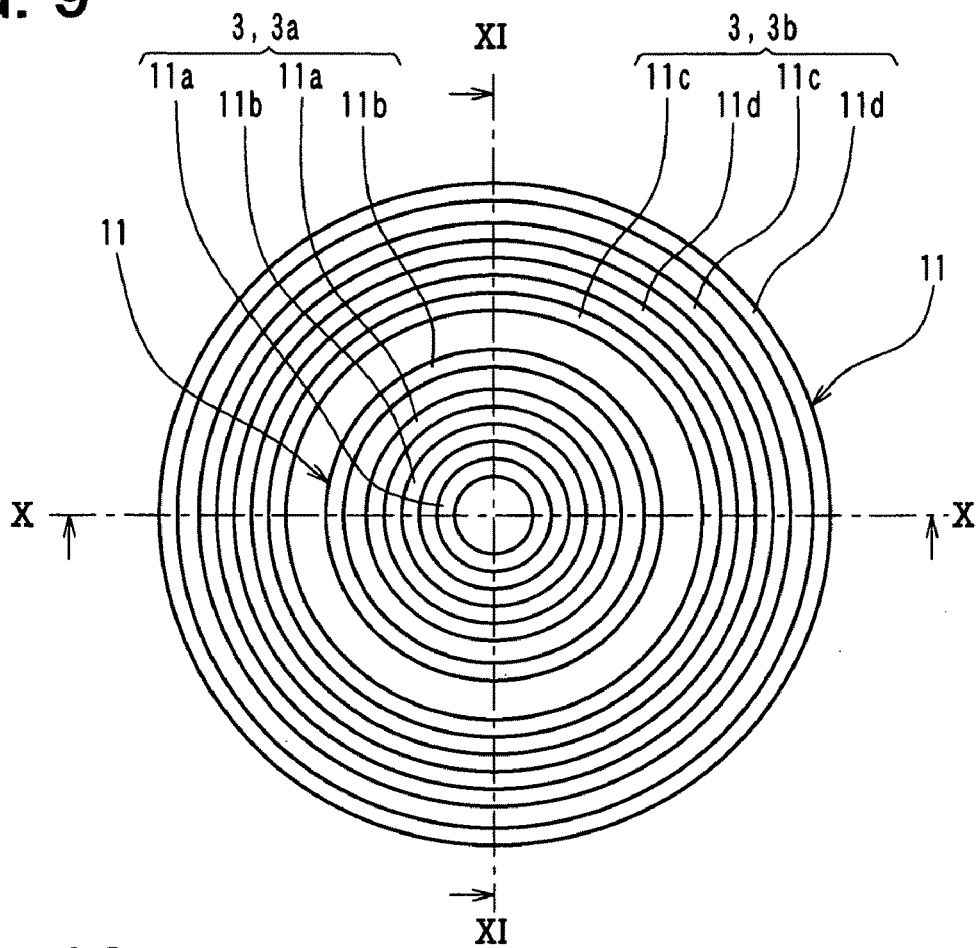
FIG. 9 is a diagram illustrating a layout on an upper surface of a SAW device according to a seventh embodiment.
Figure 10:
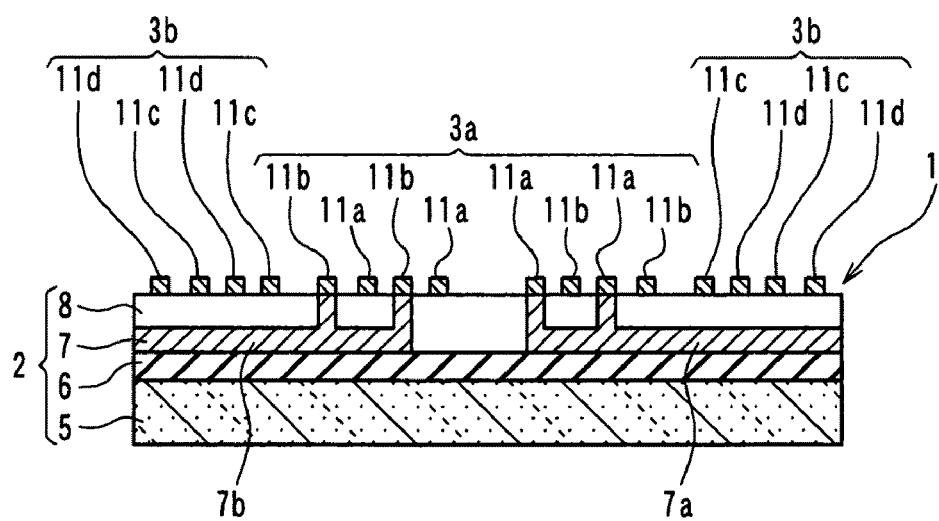
FIG. 10 is a diagram illustrating a cross section taken along line X-X in FIG. 9.

As shown in FIG. 9, the first and second transducers 3a, 3b are arranged on the plane surface of the substrate 2, so that the first transducer 3a is located radially inside of the second transducer 3b, in other words, the first transducer 3a is surrounded by the second transducer 3b. More specifically, as shown in FIG. 10, the first transducer 3a includes an electrode 11a connected with a first wiring 7a and an electrode 11b connected with a second wiring 7b, so that the electrodes 11a and 11b are alternately arranged. Further, as shown in FIG. 11, the second transducer 3b includes an electrode 11c connected with a third wiring 7c and an electrode 11d connected with a fourth wiring 7d, so that the electrodes 11c and 11d are alternately arranged.

The SAW device 1 of the present embodiment can be used as a sensor that senses deformation of the substrate 2 based on signal delay time. For example, when a predetermined AC voltage is applied to the first transducer 3a acting as a driving electrode unit, a surface acoustic wave is excited from the first transducer 3a, and then the surface acoustic wave reaches the second transducer 3b in delay time. Note that the delay time depends on a distance between the first transducer 3a and the second transducer 3b. When the substrate 2 is deformed, the distance between the first transducer 3a and the second transducer 3b varies, and the delay time of surface acoustic wave varies. Thus, by measuring the delay time of surface acoustic wave, it is possible to sense the deformation of the substrate 2.

In the above, the first transducers 3a is used as a driving electrode unit for generating surface acoustic wave, and the second transducer 3b is used as a detection electrode unit for receiving the surface acoustic wave. Alternatively, the first transducers 3a may be used as the detection electrode unit, and the second transducer 3b may be used as the generation electrode unit. In other words, one of the first transducers 3a and the second transducer 3b may be used as the driving electrode unit, and the other may be used as the detection electrode unit. In the present embodiment, one of the first transducer 3a and the second transducer 3b is an example of a first electrode unit, and the other is ax example of a second electrode unit.

In the present embodiment, since each electrode 11 of the first and second transducer 3a, 3b has a closed-ring shape, the present embodiment has the same advantage as the first embodiment has.

In the above exemplary configuration, each electrode 11 of the first transducer 3a and the second transducer 3b has a circular ring shape. Alternatively, each electrode 11 may have a closed ring shape composed of a polygonal line or a curved line as is the cases for the second to fifth embodiments.

Eighth Embodiment

Figure 12:
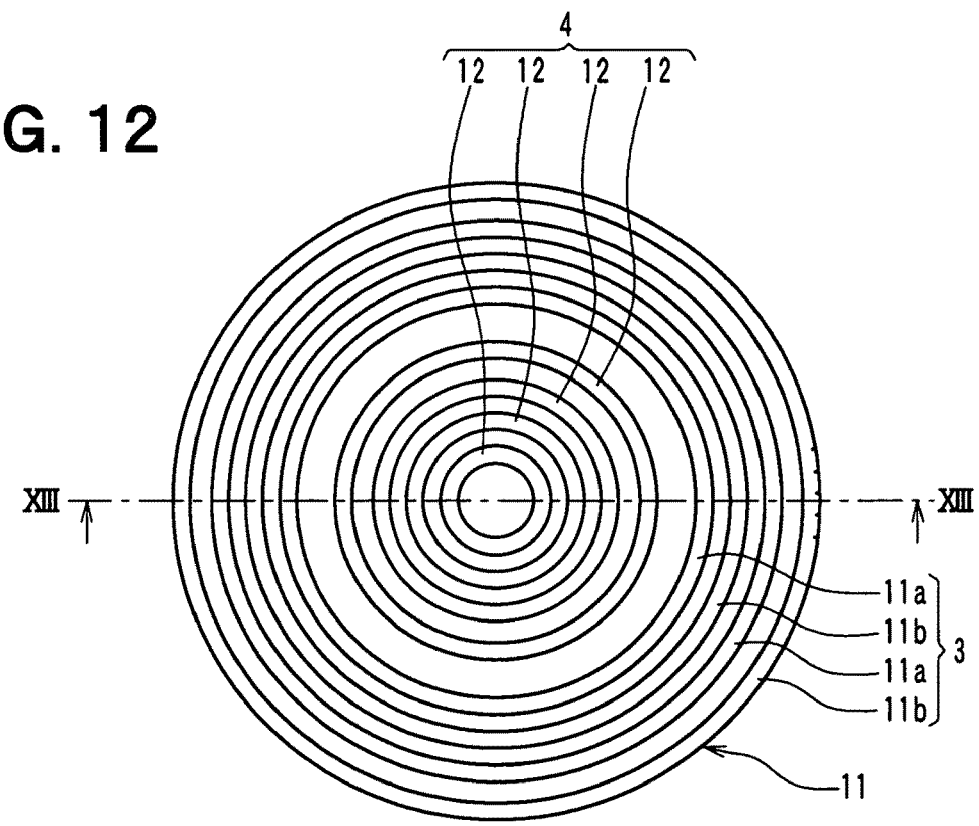
FIG. 12 is a diagram illustrating a layout on an upper surface of a SAW device according to an eighth embodiment.
Figure 13:
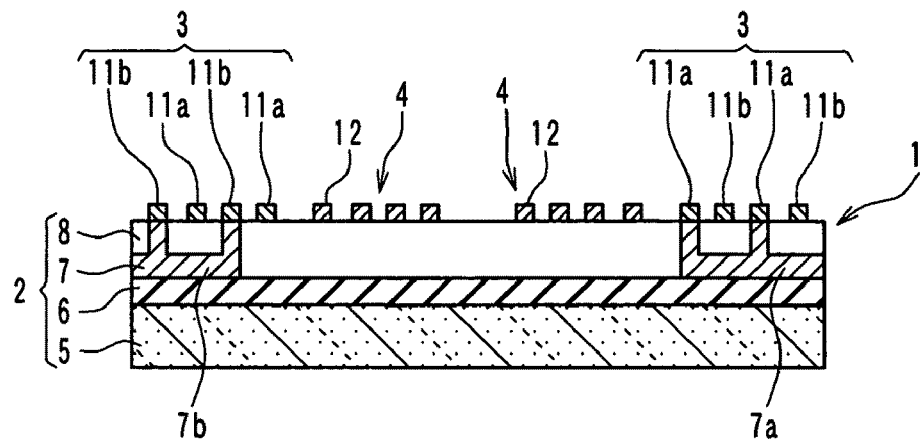
FIG. 13 is a diagram illustrating a cross section taken along line XIII-XIII in FIG. 12.

A SAW device 1 of an eighth embodiment is illustrated below with reference to FIGS. 12 and 13. The SAW device 1 of the present embodiment can be such that locations of the transducer 3 and the reflector 4 in the first embodiment are interchanged each other More specifically, in the present embodiment, the transducers 3 and the reflector 4 are arranged on the plane surface of the substrate 2, and the reflector 4 is located radially inside of the transducer 3, in other words, the reflector 4 is surrounded by the transducer 3, as shown in FIGS. 12 and 13. In the present embodiment, the transducer 3 is an example of a first electrode unit and the reflector 4 is an example of a second electrode unit. Since each electrode 11, 12 of the transducer 3 and the reflector 4 of the present embodiment has a closed-ring shape, the present embodiment has the same advantage as the first embodiment has.

The SAW device 1 can be applied to a sensor that senses deformation of the substrate 2 based on signal delay time in a manner similar to that in the seventh embodiment. In this case, since the transducer 3 is used as an electrode unit for generating and receiving surface acoustic wave, the sensor input and output can be the same.

In the above exemplary configuration, each electrode 11, 12 of the transducer 3 and the reflector 4 has a circular ring shape. Alternatively, each electrode 11, 12 may have a closed ring shape composed of a polygonal line or a curved line as is the cases for the second to fifth embodiments.

Ninth Embodiment

A SAW device 1 of a ninth embodiment is illustrated below with reference to FIGS. 14 and 15. The present embodiment can be a modification of the first embodiment. The modification includes a change in location of the wiring connected with the transducer 3. For example, location of the wiring is changed from an inside of the substrate 2 to an outside of the substrate 2 (i.e., in air).

Figure 14:
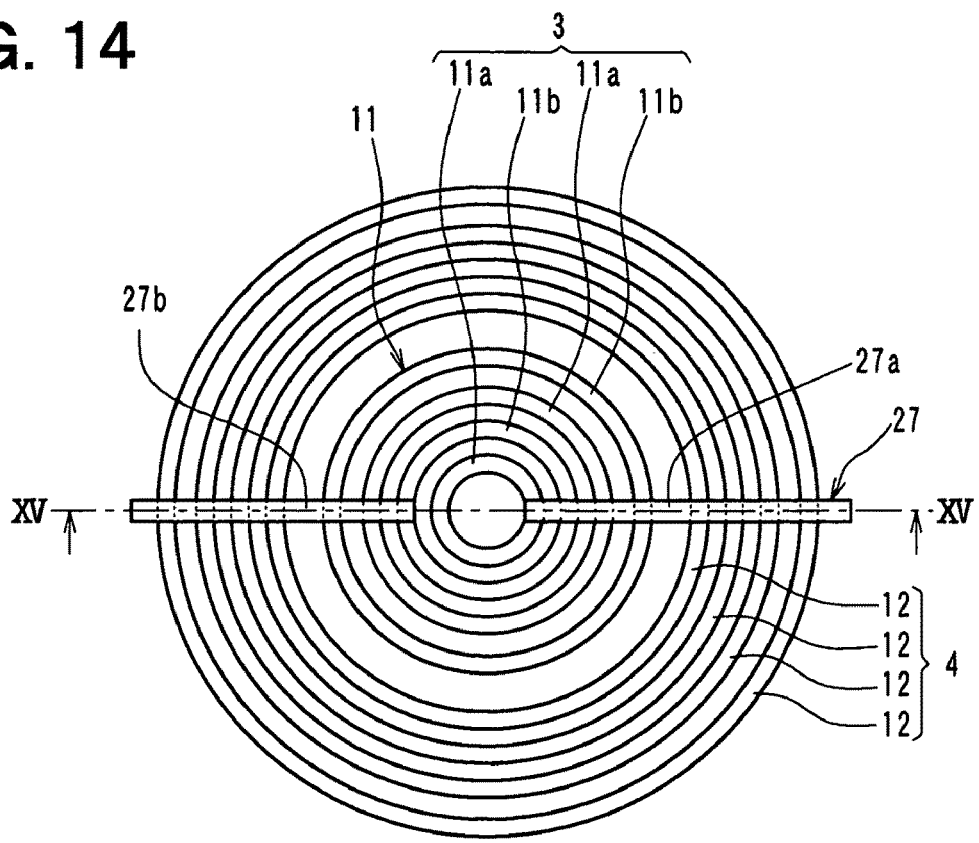
FIG. 14 is a diagram illustrating a layout on an upper surface of a SAW device according to a ninth embodiment.

As shown in FIG. 14, multiple electrodes 11 of the transducer 3 and the multiple electrodes 12 of the reflector 4 are formed on the plane surface of the substrate 2. Each electrode 11, 12 is formed as a circular ring shape in a manner similar to that in the first embodiment (see also FIG. 1).

Figure 15:
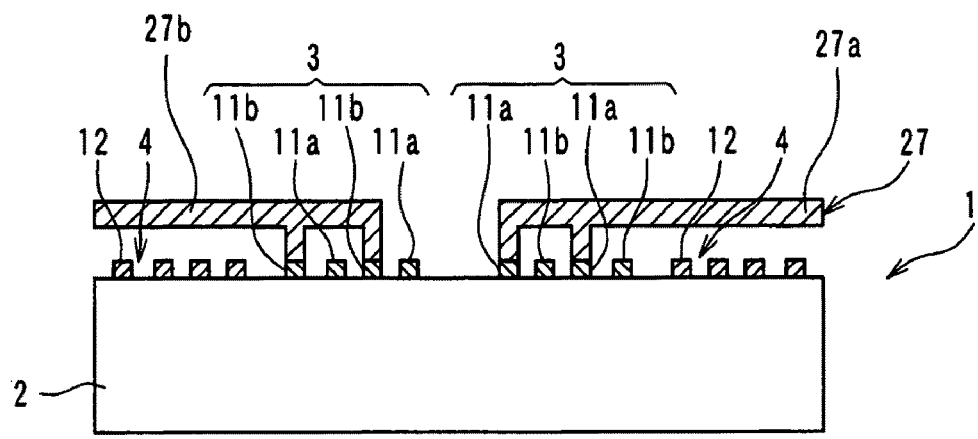
FIG. 15 is a diagram illustrating a cross section taken along line XV-XV in FIG. 14.

In the present embodiment, as shown in FIG. 15, a wiring 27 is disposed in air so as to be spaced apart from the plane surface of the substrate 2. The wiring 27 is connected with the transducer 3. In other words, the wiring 27 electrically connected with the transducer 3 is spaced apart above the plane surface of the substrate 2 by a predetermined distance. A substrate 2 is made of, for example, a single crystal of a piezoelectric material. The wiring 27 includes as a first wiring 27a and a second wiring 27b electrically insulated from each other. The first wiring 27a and the second wiring 27b are respectively connected with a first electrode 11a and a second electrode 11b of the transducer 3.

Figure 16:
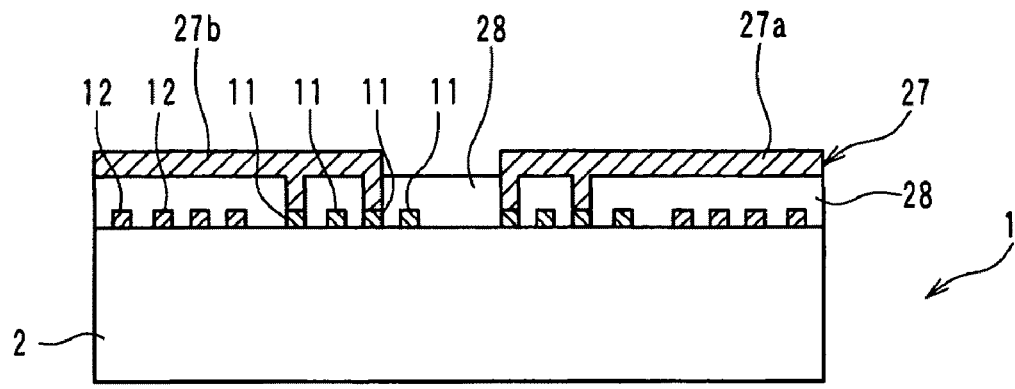
FIG. 16 is a diagram illustrating a cross section of a SAW device being in process of manufacture according to the ninth embodiment.

A method for forming a wiring 27 is described below with reference to FIG. 16, which is a diagram illustrating a cross section of a SAW device 1 that is in process of manufacture.

The multiple electrodes 11 of the transducer 3 and the multiple electrodes 12 of the reflector 4 are formed on the substrate 2 by using a process similar to that in the manufacturing method of the first embodiment. Then, as shown in FIG. 16, a sacrifice layer 28 is formed on the substrate 2 having thereon the electrodes 11, 12. A wiring, which is made of metal such as Al or the like, is formed on the sacrifice layer 28. The wiring is patterned so that the wiring 27 is formed. Then, the sacrifice layer 28 is removed by wet etching. Through the above processes, it is possible to form the wiring 27 located in air.

As seen from the above, even when the wiring 27 connected with the transducer 3 is located in air, it is possible to make the electrodes 11, 12 of the transducer 3 and the reflector 4 having a circular ring shape.

In the first embodiment, the wiring 7 connected with the transducer 3 is located inside the substrate 2 and is located at a depth of one wavelength or more below the plane surface of the substrate 2 in view of an influence of the wiring 7 on surface acoustic wave propagation. In the first embodiment, a connection part between the wiring 7 and the transducer can exist in the vicinity of the plane surface of the substrate 2, and the connection part may influence propagation of surface acoustic wave.

In the present embodiment, since the wiring 27 is disposed not inside the substrate 2 but in air, it is possible to eliminate the influence on propagation of surface acoustic wave.

In the above exemplary configuration, the change of wiring location from the inside of the substrate to the outside of the substrate (i.e., in air) is applied to the first embodiment. Alternatively, the change of wiring location from the inside of the substrate to the outside of the substrate (i.e., in air) may be applied to the second to eighth embodiments.

Tenth Embodiment

A SAW device 1 of a tenth embodiment is illustrated below with reference to FIGS. 17 and 18. The present embodiment can be a modification of the first embodiment. The modification includes a change in location of the wiring connected with the transducer 3. For example, location of the wiring is changed from the inside of the substrate 2 to the plane surface of the substrate 2.

Figure 18:
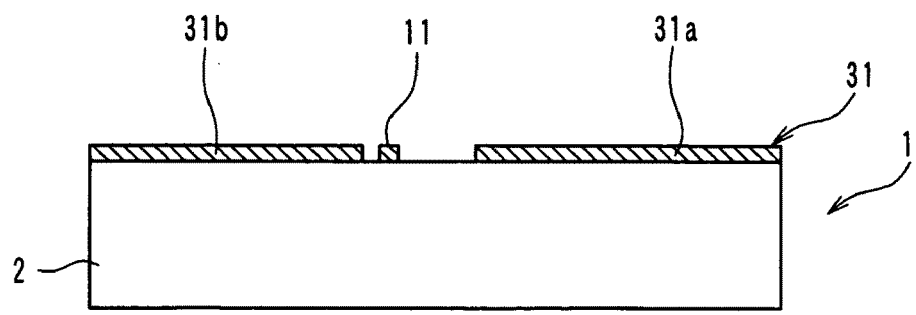
FIG. 18 is a diagram illustrating a cross section taken along line XVIII-XVIII in FIG. 17.

More specifically, as shown in FIG. 18, the electrodes 11 of the transducer 3 are arranged on the plane surface of the substrate 2, and a wiring 31 connected with the transducer 3 is arranged on the plane surface of the substrate 2. The wiring 31 and the multiple electrodes 11 are located at the same height. The wiring 32 includes a first wiring 31a and a second wiring 32b electrically insulated from each other. A positional relationship between the first and second wirings 31a, 31b may be such that the first and second wirings 31a, 31b form therebetween an angle of 180 degrees. A substrate 2 is made of, for example, a single crystal of a piezoelectric material.

The wiring 31 is made of metal such as the Al and the like, as the electrodes 11 of the transducer 3 are made of metal. The wiring 31, the transducer 3 and the reflector 4 may be formed, for example, at the same time in a manifesting process.

Figure 17:
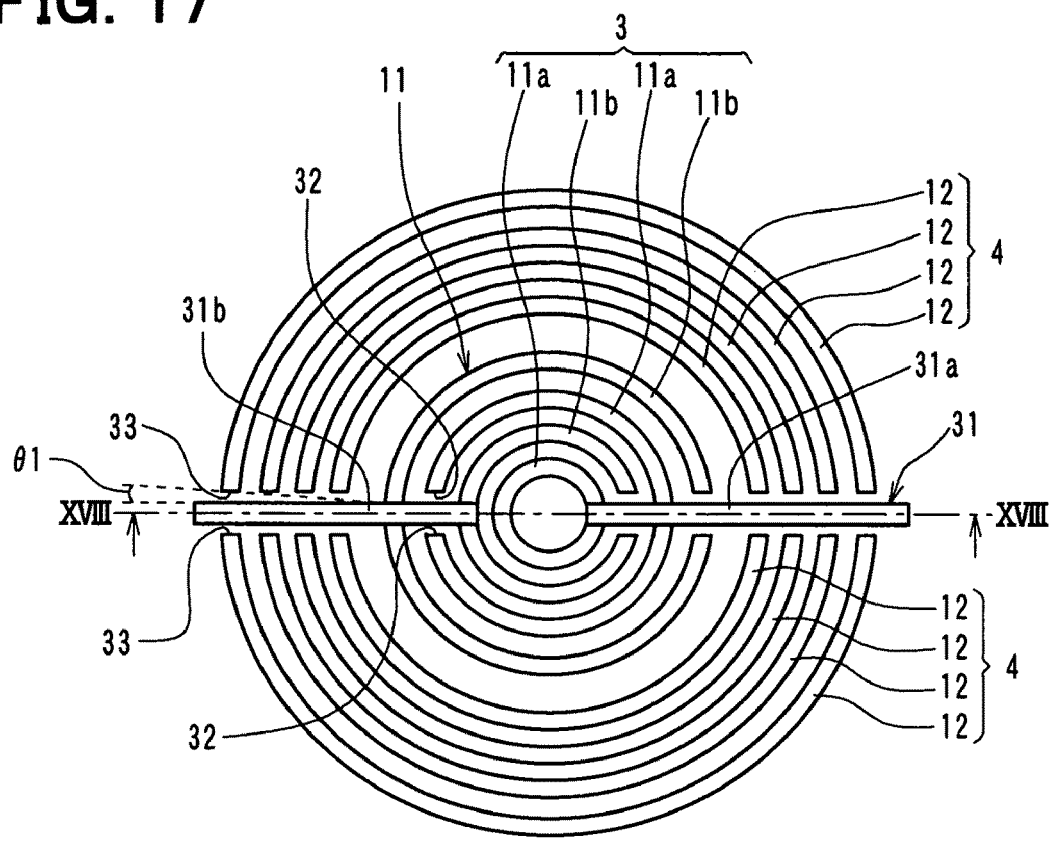
FIG. 17 is a diagram illustrating a layout on an upper surface of a SAW device according to a tenth embodiment.

As shown in FIG. 17, the transducer 3 and the reflector 4 are arranged on the plane surface of the substrate 2, so that the transducer 3 is located radially inside of the reflector 4. In other words, the reflector 4 is located radially outside of the transducer 3.

In the present embodiment, each electrode 11, 12 of the transducer 3 and the reflector 4 has a unclosed ring shape with an cutout part that is provided to sufficiently ensure a space for the wiring 31 or a space for insulation between the wiring 31 and the electrodes 11, 12, as shown in FIG. 17; whereas, in the first embodiment, each electrode 11, 12 has a closed ring shape, as shown in FIG. 1.

The transducer 3 includes an electrode 11b and an electrode 11b, which are concentric and alternately arranged at regular intervals in a radially outward direction of the transducer 3 from a center of the transducer 3. The electrode 11a is connected with the first wiring 31a, and the electrode 11b is connected with the second wiring 31b. The first and second electrodes 11a, 11b have an approximately-closed ring shape, which is close to a closed ring shape.

More specifically, the multiple electrodes 11 of the transducer 3 includes a first inward electrode 11a, a second inward electrode 11b, a third inward electrode 11a and a fourth inward electrode 11b, which are arranged in this order to correspond to increasing distance from the center of the transducer 3. Thus, the first inward electrode 11a is located most radially inward with respect to the center of the transducer 3 among the first to fourth electrodes 11a, 11b. The first inward electrode 11a is connected with the first wiring 31a and has a completely closed ring shape. The second inward electrode 11b is connected with the second wiring 31b and is located radially outside of the first inward electrode 11a. The second inward electrode 11b has an approximately-closed ring shape so as to avoid the first wiring 31a. The third inward electrode 11a is connected with the first wiring 31a, and is located radially outside of the second inward electrodes 11b. The third inward electrode 11a has an approximately-closed ring shape so as to avoid the second wiring 31b. The fourth inward electrode 11b is connected with the second wiring 31b and is located radially outside of the third inward electrode 11a. The fourth inward electrode 11b has an approximately-closed ring shape so as to avoid the first wiring 31a. An electrode having an approximately closed ring shape while avoiding a wiring 31 means that an electrode is formed in a circular ring pattern except a space for wiring 31 or a space for insulation between the electrode and the wiring 31, and the electrode would be described as a closed ring if a part for the electrode was added to the space for wiring 31 and for insulation between the electrode and the wiring 31. Each of the second to fourth inward electrodes 11 has ends, which are located in the vicinity of the wiring 31 and are located on opposite sides of the wiring 31.

The reflector 4 also has multiple electrodes 12, each of which has a approximately-closed ring shape so as to avoid the wiring 31. The multiple electrodes 12 are concentric and arranged at regular intervals. More specifically, each electrode 12 of the reflector 4 has two semicircular parts located on opposite sides of the wiring 31. An end of one semicircular part faces that of the other semicircular part through the wiring 31.

In the present embodiment, the electrodes 11, 12 of the transducer 3 and the reflector 4 have an approximately-closed ring shape, which has a cutout part and is close in shape to a completely-closed ring shape. Thus, the present embodiment can utilize surface acoustic wave energy more efficiently than a conventional SAW device, which has an IDT configured as a straight line shaped electrode or a circular arc shaped electrode. It should be noted that, in a conventional SAW device, a relatively large amount of surface acoustic wave energy is dissipated due to the diffraction caused by ends of the IDT.

Figure 19:
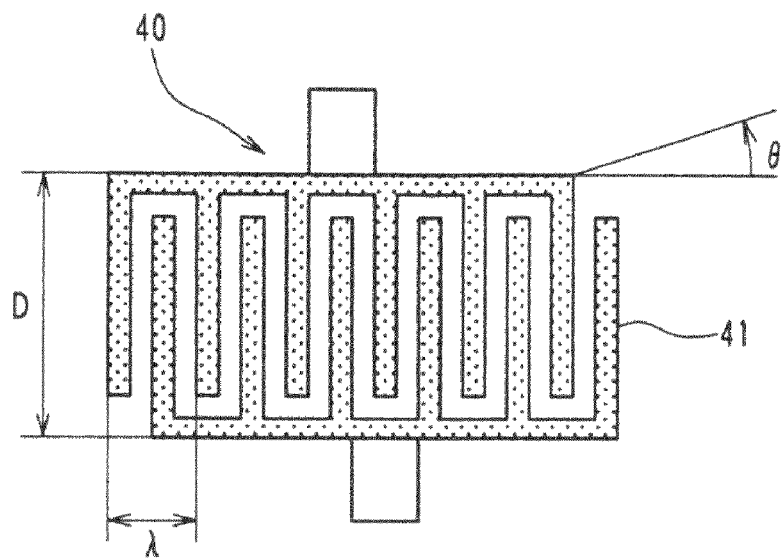
FIG. 19 is a diagram illustrating a layout on an upper surface of a SAW device according to a comparison example.
Figure 21:
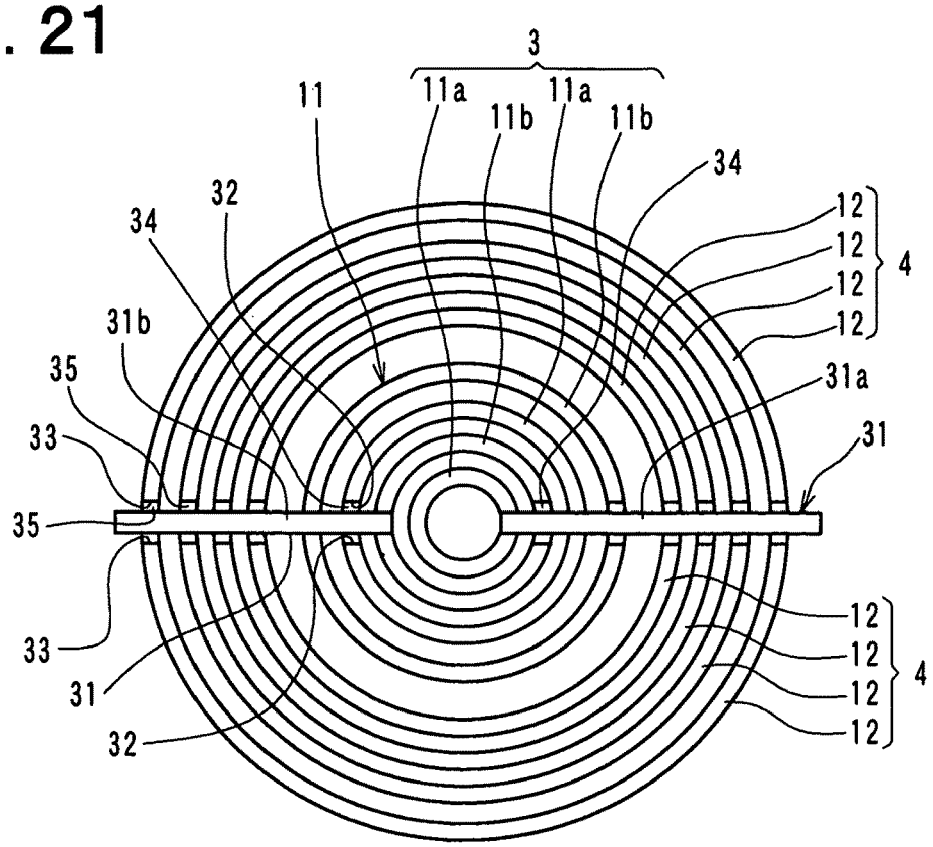
FIG. 21 is a diagram illustrating a layout on an upper surface of a SAW device according to an eleventh embodiment.

Explanation is given below on a degree of how much energy can be utilized in the above approximately-closed ring shape with a cutout part. FIG. 19 is a diagram illustrating a layout of an upper surface of a conventional SAW device in accordance with a comparison example. An IDT 40 of the SAW device in FIG. 19 has a comb-shape or an interdigital shape, and comprises a liner part 41 (i.e., a comb part 41) with a straight line shape. On an assumption that the diffracted wave results from Fraunhofer diffraction, energy P of diffracted wave, in this SAW device can be expressed as $$P = \left| \sin\left(\frac{\pi D \tan\theta}{\lambda}\right) \frac{\lambda}{\pi D \tan\theta} \right| \qquad \text{equation (1)}$$

where D is a typical length of the IDT, $\lambda$ is wavelength of surface acoustic wave, $\theta$ is an angle of propagation direction of surface acoustic wave at an end of the IDT 40. The angle $\theta$ of propagation direction is measured with respect to an axis perpendicular to the liner part 41. FIG. 21 is a graph describing a relationship given by equation (1), where a vertical axis of the graph shows the logarithm of P and a horizontal axis shows $\theta$.

Figure 20:
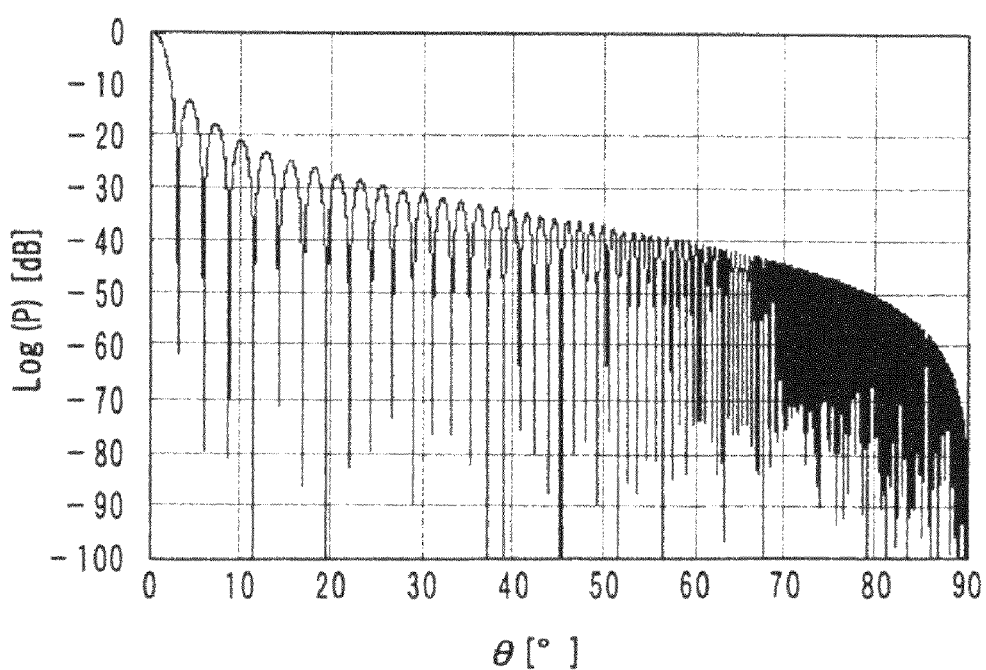
FIG. 20 is a diagram illustrating a relationship given as equation (1)

In the conventional SAW device in FIG. 20, substantially all of the energy in a range shown in FIG. 21 is dissipated, in other words, the energy in a range between 0 degree<$\theta \leq 90$ degrees is dissipated. For information, in FIG. 21, a value integrated over 0 degree<$\theta \leq 90$ degrees corresponds to an amount of dissipated energy.

In the present embodiment, on the other hand, since the electrodes 11, 12 of the transducer 3 and the reflector 4 have an approximately-closed ring shape with a cutout part, an angle $\theta 1$ at an end of the transducer 3 is much smaller than 90 degrees and is a few degrees, as shown in FIG. 17. The angle $\theta 1$ is an angle between an extension direction of the wiring 31 and a reference line (see the dashed line in FIG. 17) interconnecting two points; one point is an end of the fourth inward electrode 11b (which is located radially outermost among the electrodes 11 of the transducer 3), the end contacting the wiring 31; and the other point is an end of an electrode 12 that is located radially outermost among the electrodes 12 of the reflector 4. Thus, in the present embodiment, the energy dissipated due to an end of the transducer 3 is equal to or less than the energy in a range between 0<$\theta \leq \theta 1$ in FIG. 21. The present embodiment can utilize the energy in a range $\theta 1 < \theta$ as surface acoustic wave energy. Note that $\theta 1$ is a few degrees in the above exemplary configuration.

In the above exemplary configuration, a positional relationship between the first and second wirings 31a, 31b is such that the first and second wirings 31a, 31b form therebetween an angle of 180 degrees. Alternatively, an angle formed by the first and second wirings 31a, 31b may be more than or less than 180 degrees. In the above exemplary configuration, the first inward electrode 11a of the transducer 3 has a completely-closed ring shape. Alternatively, the first inward electrode 11a may have the approximately-closed ring shape with a cutout part. In the above exemplary configuration, each electrode 11, 12 of the transducer 3 and the reflector 4 has an approximately circular closed ring shape. Alternatively, each electrode 11, 12 may have an approximately-closed ring shape composed of a curved line or a polygonal line, as is the cases for the second to fifth embodiments.

In the above exemplary configuration, a spacing between an end of the reflector 4 and the wiring 31 is set so that the angle θ1 at the end of the transducer 3 becomes a few degrees. Alternatively, the angle θ1 may be set to a different value. For example, a spacing between an end of the reflector 4 and the wiring 31 may be set to satisfy a relation: 0 degree<θ≦45 degrees.

Eleventh Embodiment

A SAW device 1 of an eleventh embodiment is illustrated below with reference to FIG. 21. The present embodiment can be a modification of the tenth embodiment.

In the present embodiment, as shown in FIG. 21, an insulation film 34 is interposed between the wiring 31 and ends of multiple electrodes 11 of the transducer 3, so that the electrode 11 is completely closed as a whole in corporation with the wiring 31 and the insulation film 34. In other words, the electrode 11 together with the wiring 31 and the insulation film 34 form a completely-closes ring shape.

In a manner similar to the above, an insulation film 35 is interposed between the wiring 31 and ends of multiple electrodes 12 of the reflector 4, so that and the electrode 12 is completely-closed as a whole in corporation with the wiring 31 and the insulation film 35. In other words, the electrode 12 together with the wiring 31 and the insulation film 35 form a completely-closed ring shape.

According to the present embodiment, it is possible to minimize the diffraction because the wiring 31 and the electrodes 11, 12 are formed to be continuous via the insulation film 34, 35 so that each electrode 11, 12 of the transducer 3 and the reflector 4 apparently has no end. The present embodiment can therefore use the energy more efficiently than the tenth embodiment, because the present embodiment can more efficiently minimize the energy dissipation at an end of an electrode.

In the above exemplary configuration, the electrode 11, 12 of the transducer 3 and the reflector 4 is formed to have a closed circular ring as a whole in corporation with the wiring 32 and the insulation film 34, 35. Alternatively, the electrode 11, 12 may be formed to have a closed ring composed of a curved line or a polygonal line as is the cases for the second to fifth embodiments.

Twelfth Embodiment

A layout on an upper surface of a SAW device 1 according to a twelfth embodiment is illustrated in FIG. 1. A cross section of the SAW device 1 taken along line II-II in FIG. 1 is illustrated in FIG. 2. It should be noted that the SAW devices 1 of the present embodiment and the first embodiment can be the same in appearance. A difference between the first embodiment and the present embodiment includes the followings.

In the present embodiment, the substrate 2 illustrated in FIG. 2 employs such a base 5 and a piezoelectric film 8 that the speed of the surface acoustic wave is isotropic on the plane surface of the substrate 2. The base 5 is made of, for example, a silicon cut in the (111) orientation, a silicon carbide cut in the (001) orientation, a sapphire cut in the (001) orientation, or the like. The piezoelectric film 8 is, for example, an AlN film, a c-axial oriented ZnO film, a c-axial oriented GaN film or the like. According to this configuration, the surface acoustic wave propagates at the same speed in any direction on the plane surface of the substrate 2. Hence, the surface acoustic wave spreading in a circular pattern can be confined in the most efficient manner.

Other Embodiments

The above embodiments can be modified in various ways, examples of which are described below.

(1) In the SAW device of the tenth or eleventh embodiment, the wiring connected with the transducer 3 is located on the plane surface of the substrate 2; while, in the first embodiment, the wiring connected with the transducer 3 is located inside the substrate 3. In the SAW device of the sixth to eighth embodiments also, location of the wiring connected with the transducer 3 may be changed from the inside of the substrate 2 to the plane surface of the substrate 2.

Figure 22:
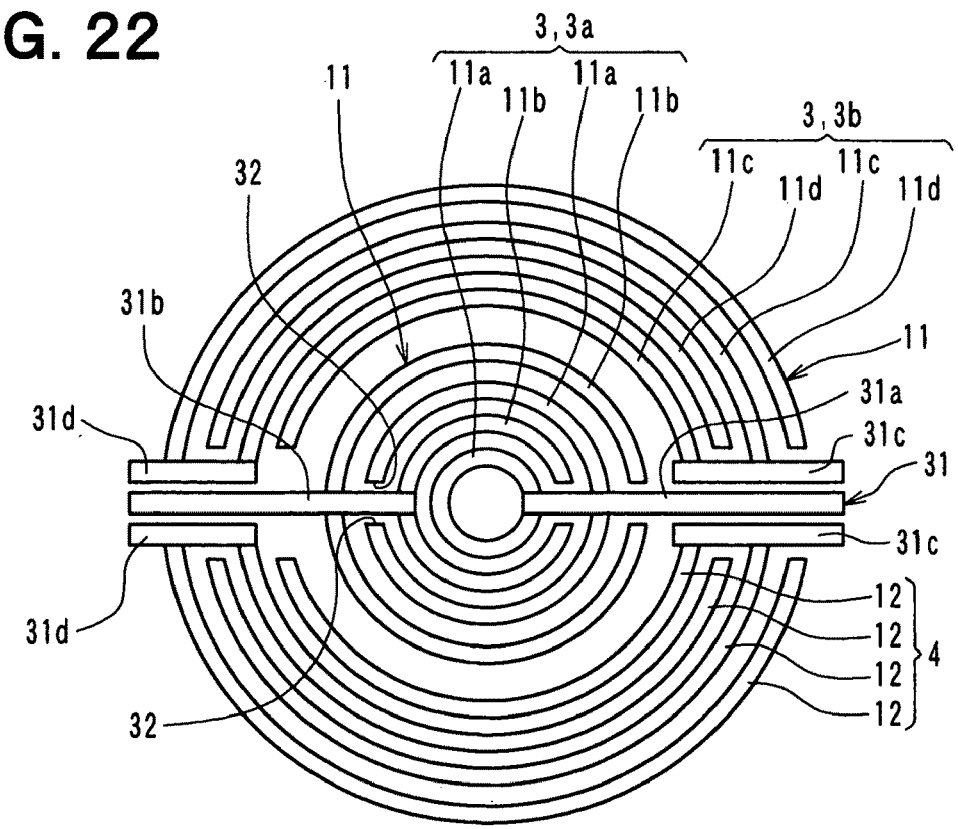
FIG. 22 is a diagram illustrating a layout on an upper surface of a SAW device according to a modification example.

FIG. 22 is a diagram illustrating a layout of an upper surface of a SAW device in which a first transducer 3 is located radially inward and a second transducer 3 is located radially outside of the first transducer 3 in a manner similar to that in the seventh embodiment. For the SAW device, of the seventh embodiment, when location of the wiring connected with the transducer 3 is changed from the inside of the substrate 2 to the plane surface of the substrate 2, the following modification may be made in the surface acoustic wave illustrated in FIG. 17. The transducer 3 is set to a first transducer 3a, and the reflector 4 is replaced with a second transducer 3b.

Further, as shown in FIG. 22, for the second transducer 3b, two third wirings 31c are located on opposite sides of the first wiring 31a so as to extend along the first wiring 31a, and two fourth wirings 31d are located on opposite sides of the second wiring 31b so as to extend along the second wiring 31b. Further, an electrode 11c connected with the third wirings 31c is formed as a ring shape so as to avoid the second and fourth wirings 31b, 31d. An electrode 11d connected with the fourth wirings 31d is formed as a ring shape so as to avoid the first and third wirings 31a, 31c.

In the exemplary configuration shown in FIG. 22, the wirings connected with the first and second transducers 3a, 3b are located on the plane surface of the substrate. Alternatively, the wiring connected with one of the first and second transducer 3a, 3b may be formed on the plane surface of the substrate, and the wiring connected with the other of the first and second transducer 3a, 3b may be located inside the substrate or in air.

(2) Although the shape of the plane surface of the substrate 2 is assumed to be quadrilateral in the above embodiments, the plane surface is not limited to quadrilateral but may have different shapes.

While the invention has been described above with reference to various embodiments thereof, it is to be understood that the invention is not limited to the above described embodiments and constructions. The invention is intended to cover various modifications and equivalent arrangements. In addition, while the various combinations and configurations described above are contemplated as embodying the invention, other combinations and configurations, including more, less or only a single element, are also contemplated as being within the scope of embodiments.

What is claimed is:
1. A surface acoustic wave device comprising:
a first electrode unit capable of generating or receiving a surface acoustic wave;
a second electrode unit physically spaced apart from the first electrode unit;

a substrate having a plane surface on which the first electrode unit and the second electrode unit are formed, wherein a part of or all of the substrate is made of a piezoelectric material;

a wiring connected with the first electrode unit and formed on the plane surface of the substrate; and an insulation film, wherein:

the first electrode unit includes a plurality of first electrodes each of which has a ring shape composed of one of a curved line and a polygonal chain, the ring shape being arranged to avoid the wiring, the plurality of first electrodes being concentrically arranged at predetermined intervals;

the second electrode unit includes a plurality of second electrodes each of which has the ring shape composed of one of the curved line and the polygonal chain, the ring shape being arranged to avoid the wiring, the plurality of second electrodes being arranged at the predetermined intervals and being on a radially outside or radially inside of the first electrode unit, the plurality of second electrodes being concentric with respect to the first electrode unit;

the insulation film is interposed between the wiring and an end of each electrode of the first and second electrode units; and the wiring and the each electrode of the first and second electrode units are continuous through the insulation film.

2. The surface acoustic wave device according to claim 1, wherein:

the first electrode unit is a driving electrode unit that generates the surface acoustic wave and the second electrode unit is a detection electrode unit that detects the surface acoustic wave propagating to the detection electrode unit.

3. The surface acoustic wave device according to claim 1, wherein:

each of the plurality of first electrodes, which is arranged at the predetermined intervals, of the first electrode unit is a polygonal ring shape.

4. The surface acoustic wave device according to claim 3, wherein:

each of the plurality of first electrodes of the first electrode unit has the polygonal ring shape that has an even number of corners.

* * * * *